(12) United States Patent
Sankman et al.

(10) Patent No.: US 11,658,122 B2
(45) Date of Patent: May 23, 2023

(54) EMIB PATCH ON GLASS LAMINATE SUBSTRATE

(71) Applicant: Intel Corporation, Santa Clara, CA (US)

(72) Inventors: Robert Sankman, Phoenix, AZ (US); Robert May, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 904 days.

(21) Appl. No.: 16/356,442

(22) Filed: Mar. 18, 2019

(65) Prior Publication Data

US 2020/0303309 A1 Sep. 24, 2020

(51) Int. Cl.
*H01L 23/538* (2006.01)
*H01L 25/00* (2006.01)
*H01L 25/065* (2023.01)
*H01L 21/48* (2006.01)

(52) U.S. Cl.
CPC ...... *H01L 23/5381* (2013.01); *H01L 21/4857* (2013.01); *H01L 23/5383* (2013.01); *H01L 23/5385* (2013.01); *H01L 23/5386* (2013.01); *H01L 25/0655* (2013.01); *H01L 25/50* (2013.01)

(58) Field of Classification Search
None
See application file for complete search history.

(56) References Cited

U.S. PATENT DOCUMENTS

2017/0012020 A1* 1/2017 Ooi .................. H01L 23/498

OTHER PUBLICATIONS

Office Action from Malaysian Patent App. No. PI2020000587, dated Jan. 31, 2023, 5 pgs.

* cited by examiner

*Primary Examiner* — Long Pham
(74) *Attorney, Agent, or Firm* — Schwabe, Williamson & Wyatt P.C.

(57) ABSTRACT

Embodiments disclosed herein include electronic packages for PoINT architectures. Particularly, embodiments include electronic packages that include reinforcement substrates to minimize warpage. In an embodiment, an electronic package comprises, a reinforcement substrate, a plurality of through substrate vias through the reinforcement substrate, a dielectric substrate over the reinforcement substrate, a cavity into the dielectric substrate, and a component in the cavity.

27 Claims, 12 Drawing Sheets

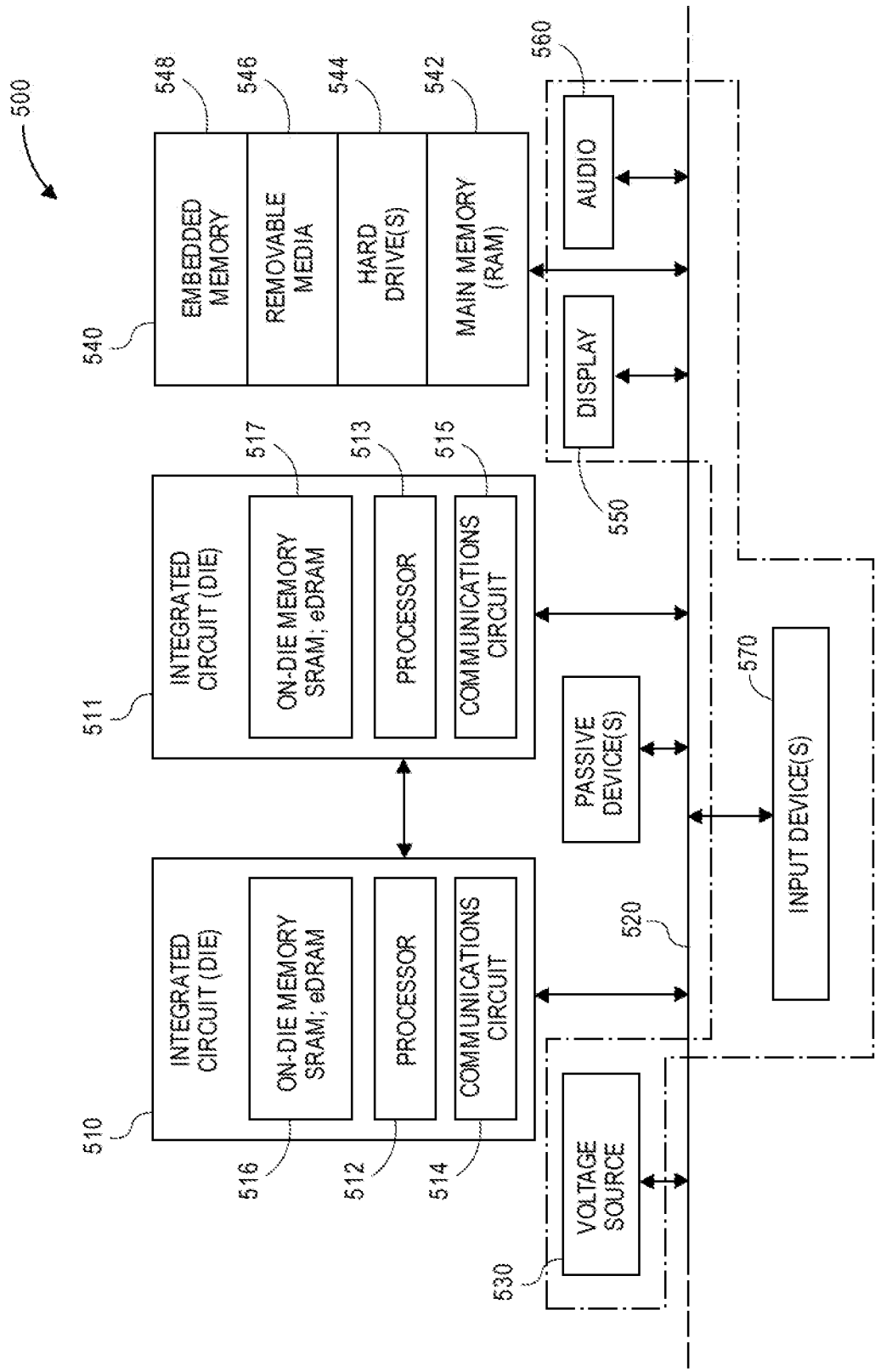

EMIB PATCH ON GLASS LAMINATE SUBSTRATE

TECHNICAL FIELD

Embodiments of the present disclosure relate to electronic packaging, and more particularly, to electronic packages with an embedded multi-die interconnect bridge (EMIB) patch that is over a reinforcement substrate and methods of forming such electronic packages.

BACKGROUND

Large packages with many embedded bridges (e.g., embedded multi-die interconnect bridges (EMIB)) are challenging to construct due to shrinkage and local warpage of an organic laminate substrate. This makes assembly of a patch on interposer (PoINT) package difficult, if not impossible, to fabricate.

PoINT packages are a multi-layer high density laminate package surface mounted to a larger lower density organic laminate substrate. The connection between the high density laminate package and the lower density organic laminate substrate utilizes a pitch of 400 µm and a low melting point solder. The large pitch and low melting point solder are used in order to mitigate or prevent warpage of the top substrate. It is currently not possible to implement EMIBs in such an architecture because there would not be a suitable surface mount technology (SMT) solution.

BRIEF DESCRIPTION OF THE DRAWINGS

FIG. 5 is a schematic of a computing device built in accordance with an embodiment.

EMBODIMENTS OF THE PRESENT DISCLOSURE

Described herein are electronic packages with an embedded multi-die interconnect bridge (EMIB) patch that is over a reinforcement substrate and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, warpage prevents the use of embedded bridges (e.g., EMIBs) from being used in large PoINT architectures, for example, larger than 20 mm×20 mm. Accordingly, embodiments disclosed herein include an electronic package that includes additional mechanical support that mitigates warpage. As such, EMIBs may be used in PoINT architectures. Such embodiments, therefore, allow for die tiling, heterogeneous chip integration, and provide improved processing capabilities compared to PoINT architectures that must rely on a single die.

In an embodiment, additional mechanical support is provided to the dielectric substrate by a reinforcement substrate. For example, a laminated reinforcement substrate may be attached to a bottom surface of the dielectric substrate. The reinforcement substrate may comprise through substrate vias that allow for electrical signals to be passed through the reinforcement layer. The through substrate vias of the reinforcement substrate may then be attached to an interposer with standard solder mid-level interconnects (MLIs).

Figure 1A:
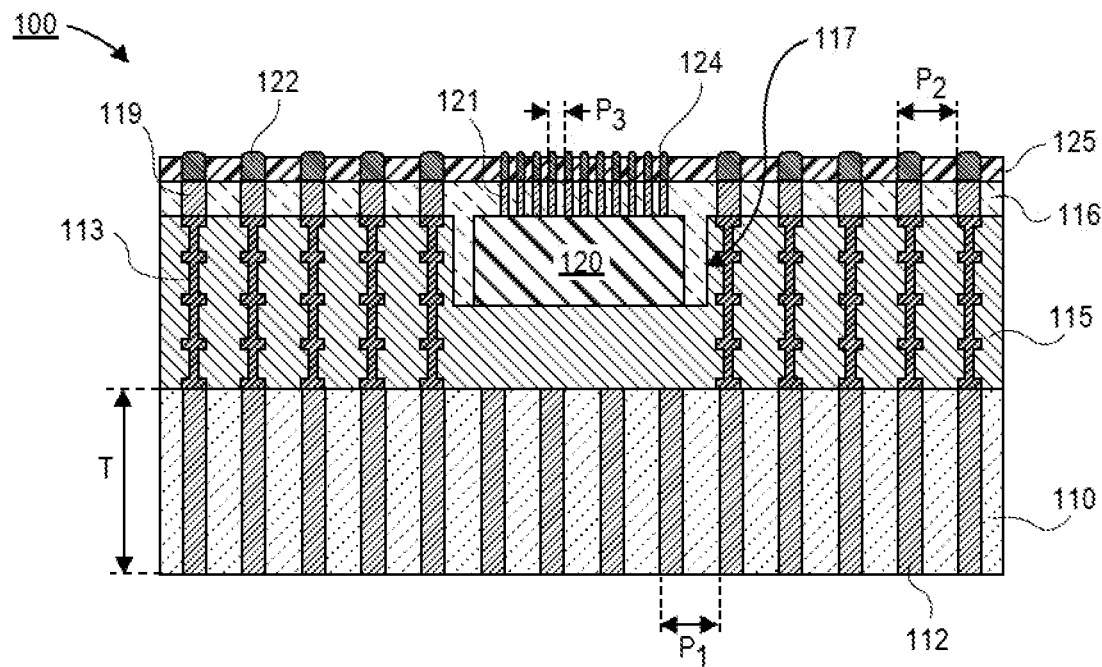
FIG. 1A is a cross-sectional illustration of an electronic package with a reinforcement substrate and a dielectric substrate over the reinforcement substrate where an EMIB is embedded in the dielectric substrate, in accordance with an embodiment.

Referring now to FIG. 1A, a cross-sectional illustration of an electronic package 100 is shown, in accordance with an embodiment. In an embodiment, the electronic package 100 may comprise a reinforcement substrate 110. For example the reinforcement substrate 110 may be a glass substrate. However, it is to be appreciated that other non-conductive and rigid dimensionally stable substrates may be used in other embodiments. In an embodiment, the reinforcement substrate may have a thickness T. The thickness T may be between 100 µm and 1,000 µm. In a particular embodiment, the thickness T may be approximately 500 µm.

In an embodiment, electrical connections from a first surface of the reinforcement substrate 110 to a second surface of the reinforcement substrate 110 may be provided by a plurality of through substrate vias 112. In the case of a glass substrate 110 the through substrate vias 112 may be referred to as through glass vias (TGVs). In an embodiment, the through substrate vias 112 may have a first pitch $P_1$. For example, the first pitch $P_1$ may range from 80 µm to 200 µm. The through substrate vias 112 may comprise a conductive material, such as copper. In some embodiments, the through substrate vias 112 may comprise a liner, a barrier layer, or the like.

In an embodiment, the electronic package 100 may further comprise a dielectric substrate 115. The dielectric substrate 115 may be over a surface of the reinforcement substrate 110. The dielectric substrate 115 may comprise a plurality of laminated dielectric layers. For example, the dielectric layers may comprise organic layers, as is known in the art. While a dielectric substrate 115 is positioned over one of the surfaces of the reinforcement substrate 110, it is to be appreciated that the opposing surface (i.e., the bottom surface in FIG. 1A) is not covered by a dielectric substrate (or layer). This is in contrast to typical cored packages that include dielectric layers both above and below the core. In an embodiment, the reinforcement substrate 110 may have a coefficient of thermal expansion (CTE) that is between 2 and 10 ppm. The CTE may be tuned to minimize warpage of the PoINT package construction. Furthermore, the Young's modulus of the reinforcement substrate 110 may be significantly higher than the Young's modulus of the dielectric substrate. For example, the Young's modulus of the reinforcement substrate 110 may be greater than 50 GPa. In a particular embodiment, the Young's modulus may be between 60 GPa and 100 GPa.

In an embodiment, the dielectric substrate 115 may comprise conductive routing 113. The conductive routing 113 may provide electrical coupling from the through substrate vias 112 up through the package to the opposing surface of the dielectric substrate. For example, the conductive routing 113 may comprise traces, pads, vias, or the like.

In an embodiment, the dielectric substrate 115 may comprise one or more cavities 117. In an embodiment, the cavities 117 are formed into the surface of the dielectric substrate 115. The cavities 117 may be sized to accommodate one or more bridges 120. In an embodiment, the bridges 120 are passive components that provide fine line spacing (FLS) connections between dies (not shown in FIG. 1A). For example, the bridges 120 may be silicon dies with a plurality of conductive traces and pads for electrically coupling dies together. In some embodiments, the bridges 120 may be referred to as a bridge substrate or an EMIB. While a single bridge 120 is shown in FIG. 1A, it is to be appreciated that electronic package 100 may comprise any number of bridges 120. For example, ten or more bridges 120 may be embedded in the dielectric substrate 115. In some embodiments, each cavity 117 may house a single bridge 120, or a plurality of bridges 120 may be housed in a single cavity 117.

In an embodiment, a dielectric layer 116 may be disposed over the dielectric substrate 115 and the bridge 120. That is, the dielectric layer 116 may fill remaining space in the cavity 117 and cover the top surface of the bridge 120. For example, the dielectric layer 116 covers the sidewalls and the top surface of the bridge 120. While shown as a distinct layer from the dielectric substrate 115, it is to be appreciated that the dielectric layer 116 may be the same material as the dielectric substrate 115. As such, there may be no discernable boundary between the dielectric substrate 115 and the dielectric layer 116 in some embodiments.

In an embodiment, a plurality of vias 119, 121 may be fabricated in the dielectric layer 116. The vias 119 may provide routing to conductive layers in the dielectric substrate 115, and vias 121 may provide routing to the bridge 120. In an embodiment, vias 119 may have a second pitch $P_2$ and vias 121 may have a third pitch $P_3$. In an embodiment, the second pitch $P_2$ may be substantially equal to the first pitch $P_1$ of the through substrate vias 112. In some embodiments, the vias 119 may be substantially aligned with the through substrate vias 112. That is, each of the vias 119 may be aligned above one of the through substrate vias 112. In such embodiments, there may be no need for any pitch translation implemented in the dielectric substrate 115.

In an embodiment, the third pitch $P_3$ of the vias 121 may be smaller than the first pitch $P_1$ and the second pitch $P_2$. The smaller pitch allows for FLS to be implemented in order to bridge together dies with high density I/Os. In an embodiment, the third pitch $P_3$ may range from between 20 µm and 60 µm.

In an embodiment, a solder resist layer 125 may be disposed over the dielectric layer 116. The solder resist layer 125 may have solder resist openings (SROs) that provide access to the vias 119, 121. In an embodiment, a solder 122, 124 may be disposed in the SROs through the solder resist layer 125.

Figure 1B:
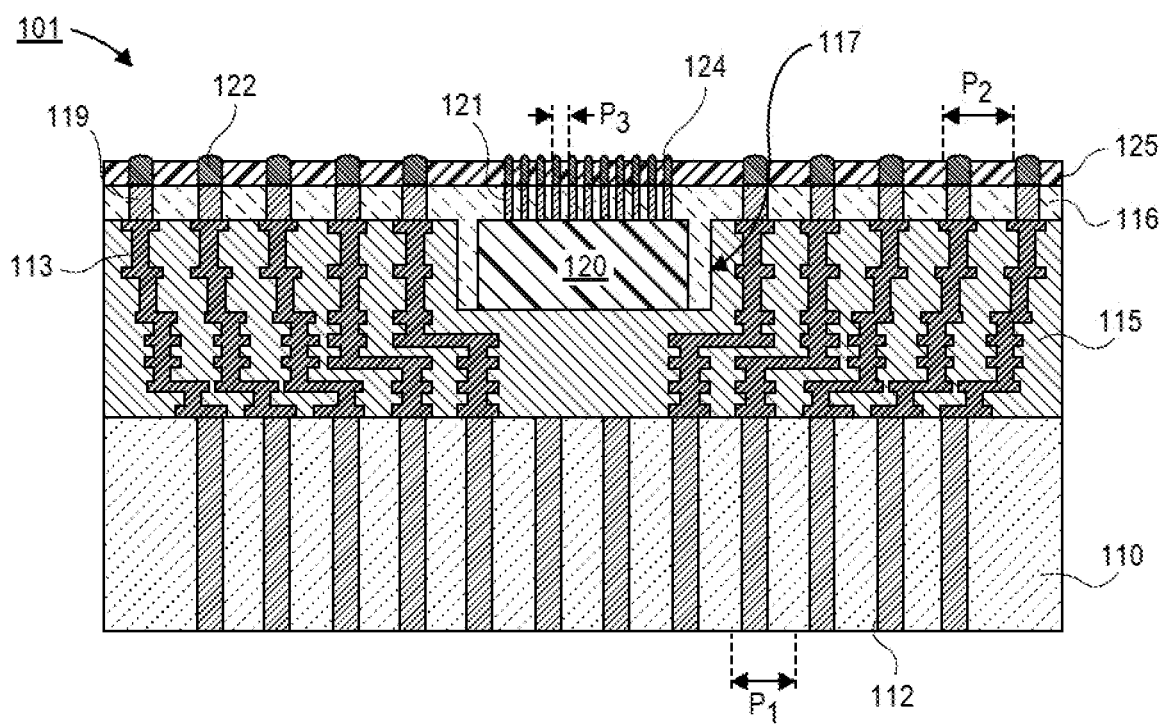
FIG. 1B is a cross-sectional illustration of an electronic package with a reinforcement substrate with through substrate vias and a dielectric substrate, where contacts on the dielectric substrate have a different pitch than the through substrate vias, in accordance with an embodiment.

Referring now to FIG. 1B, a cross-sectional illustration of an electronic package 101 is shown, in accordance with an embodiment. The electronic package 101 may be substantially similar to the electronic package 100 in FIG. 1A, with the exception that the through substrate vias 112 and the vias 119 have different pitches. For example, the first pitch $P_1$ of the through substrate vias 112 may be greater than a second pitch $P_2$ of the vias 119. In such an embodiment, pitch translation may be implemented by conductive routing 113 in the dielectric substrate 115.

Figure 1C:
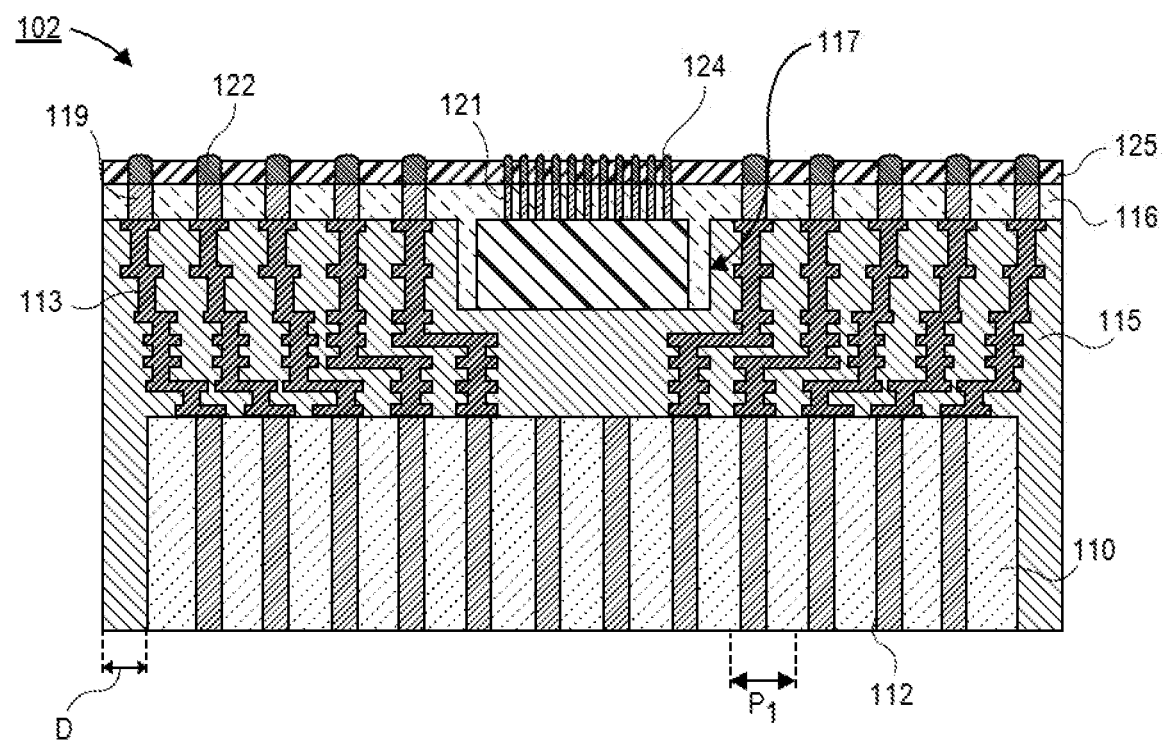
FIG. 1C is a cross-sectional illustration of an electronic package with a reinforcement substrate and a dielectric substrate over the reinforcement substrate, where an edge of the reinforcement substrate is recessed from an edge of the dielectric substrate, in accordance with an embodiment.

Referring now to FIG. 1C, a cross-sectional illustration of an electronic package 102 is shown, in accordance with an embodiment. In an embodiment, the electronic package 102 may be substantially similar to the electronic package 100 in FIG. 1A, with the exception that the reinforcement substrate 110 has a different width than the dielectric substrate 115. Particularly, the reinforcement substrate 110 may have a width that is less than a width of the dielectric substrate 115. For example, sidewalls of the reinforcement substrate 110 may be set back from the sidewalls of the dielectric substrate 115 by a distance D. The reduced thickness of the reinforcement substrate 110 provides a portion of the dielectric substrate 115 wrapping around the side of the reinforcement substrate 110.

An electronic package 102 with a reduced width reinforcement substrate 110 provides improved manufacturability. This is because there is no need to cut through glass during singulation processes. As such, existing singulation processes may be used since only the dielectric substrate 115 needs to be cut.

Referring now to FIGS. 2A-2G, a series of cross-sectional illustrations depicting a process for fabricating an electronic package with a reinforcement layer is shown, in accordance with an embodiment. In the illustrated embodiments, only a portion of the substrates are shown. Particularly, it is to be appreciated that fabrication of the package may be implemented at a panel level, a quarter-panel level, a strip, or the like. In such embodiments, a plurality of electronic packages may be fabricated substantially in parallel with each other.

Figure 2A:
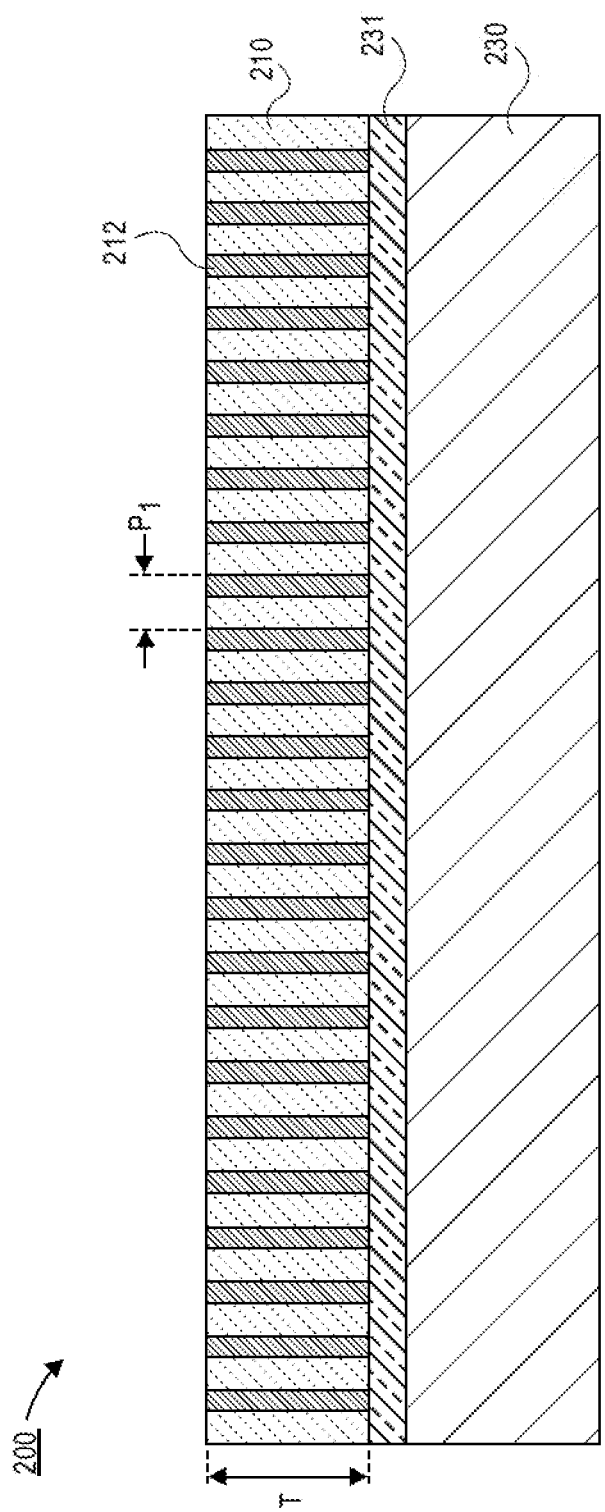
FIG. 2A is a cross-sectional illustration of a reinforcement substrate attached to a carrier, in accordance with an embodiment.

Referring now to FIG. 2A, a cross-sectional illustration of an electronic package 200 is shown, in accordance with an embodiment. In an embodiment, the electronic package 200 may comprise a reinforcement substrate 210 that is attached to a carrier 230. For example, the reinforcement substrate 210 may be attached to the carrier 230 with an adhesive 231. The adhesive 231 may be released when exposed to ultraviolet radiation in some embodiments.

In an embodiment, the reinforcement substrate 210 may be disposed over the carrier 230 with a lamination process. In some embodiments, the reinforcement substrate 210 may have through substrate vias 212 disposed in the reinforcement substrate 210 prior to lamination. In other embodiments, the through substrate vias 212 may be patterned and filled (e.g., with copper) after the reinforcement substrate 210 is attached to the carrier 230. In an embodiment, the through substrate vias 212 may have a first pitch $P_1$.

In an embodiment, the reinforcement substrate 210 comprises glass. The reinforcement substrate 210 may have a thickness suitable for providing mechanical stability sufficient to minimize or mitigate warpage of a subsequently formed dielectric substrate. For example, the reinforcement substrate 210 may have a thickness T that is between 100 µm and 1,000 µm. In a particular embodiment, a thickness T of the reinforcement substrate 210 may be approximately 500 µm.

Figure 2B:
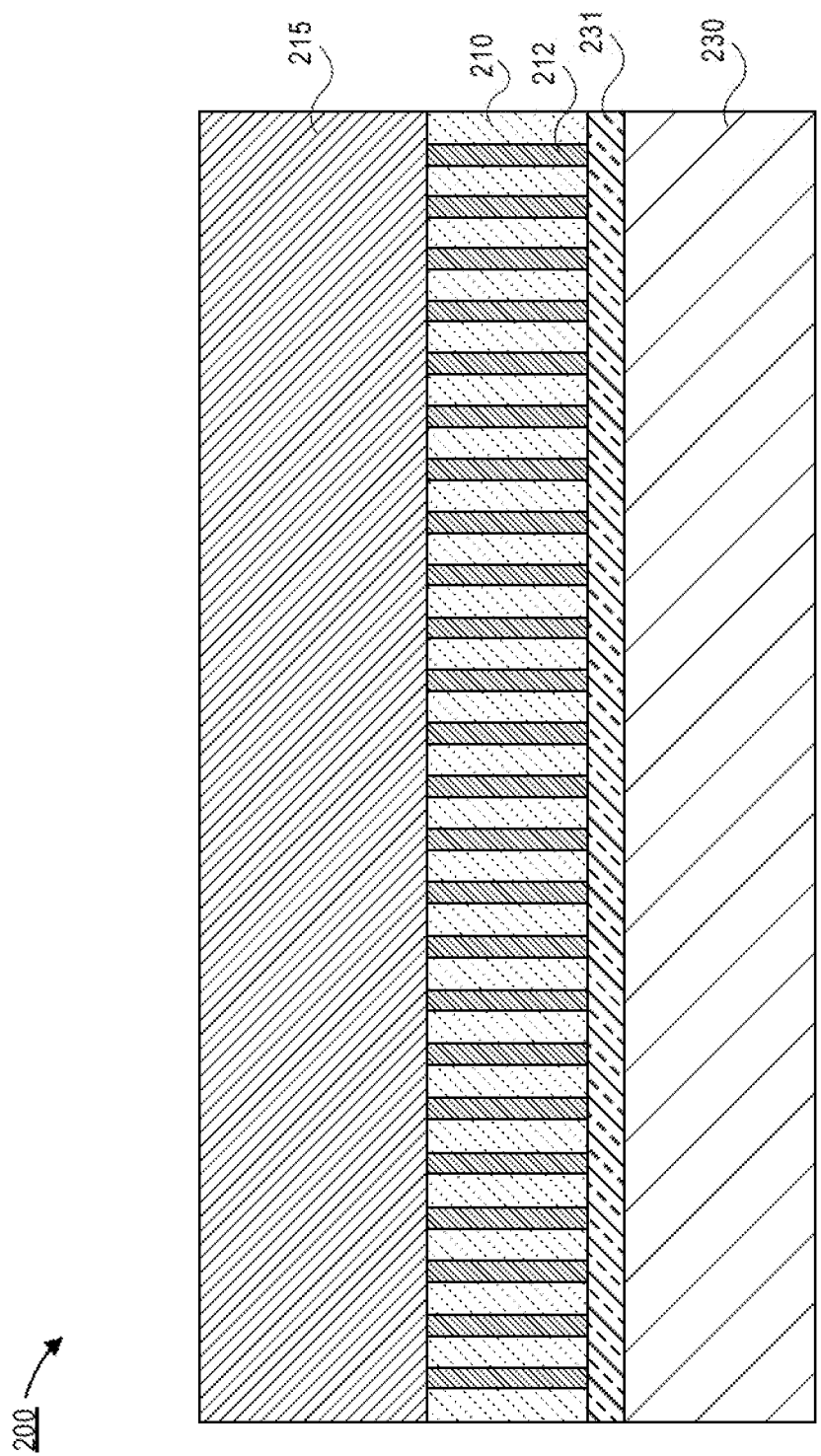
FIG. 2B is a cross-sectional illustration after a dielectric substrate is disposed over the reinforcement substrate, in accordance with an embodiment.

Referring now to FIG. 2B, a cross-sectional illustration of the electronic package 200 after a dielectric substrate 215 is disposed over the reinforcement substrate 210 is shown, in accordance with an embodiment. In an embodiment, the dielectric substrate 215 may comprise a plurality of organic layers that are laminated over each other. In an embodiment, electrical routing (not shown) may pass through the dielectric substrate 215 to provide electrical connections to the through substrate vias 212.

As shown, a dielectric substrate 215 is only formed over a single (i.e., top) surface of the reinforcement substrate 210. That is, the processing may be referred to as a single sided substrate fabrication in some embodiments. This is distinct from the fabrication of cored packages, in that dielectric layers are typically formed over both surfaces of a package core.

Figure 2C:
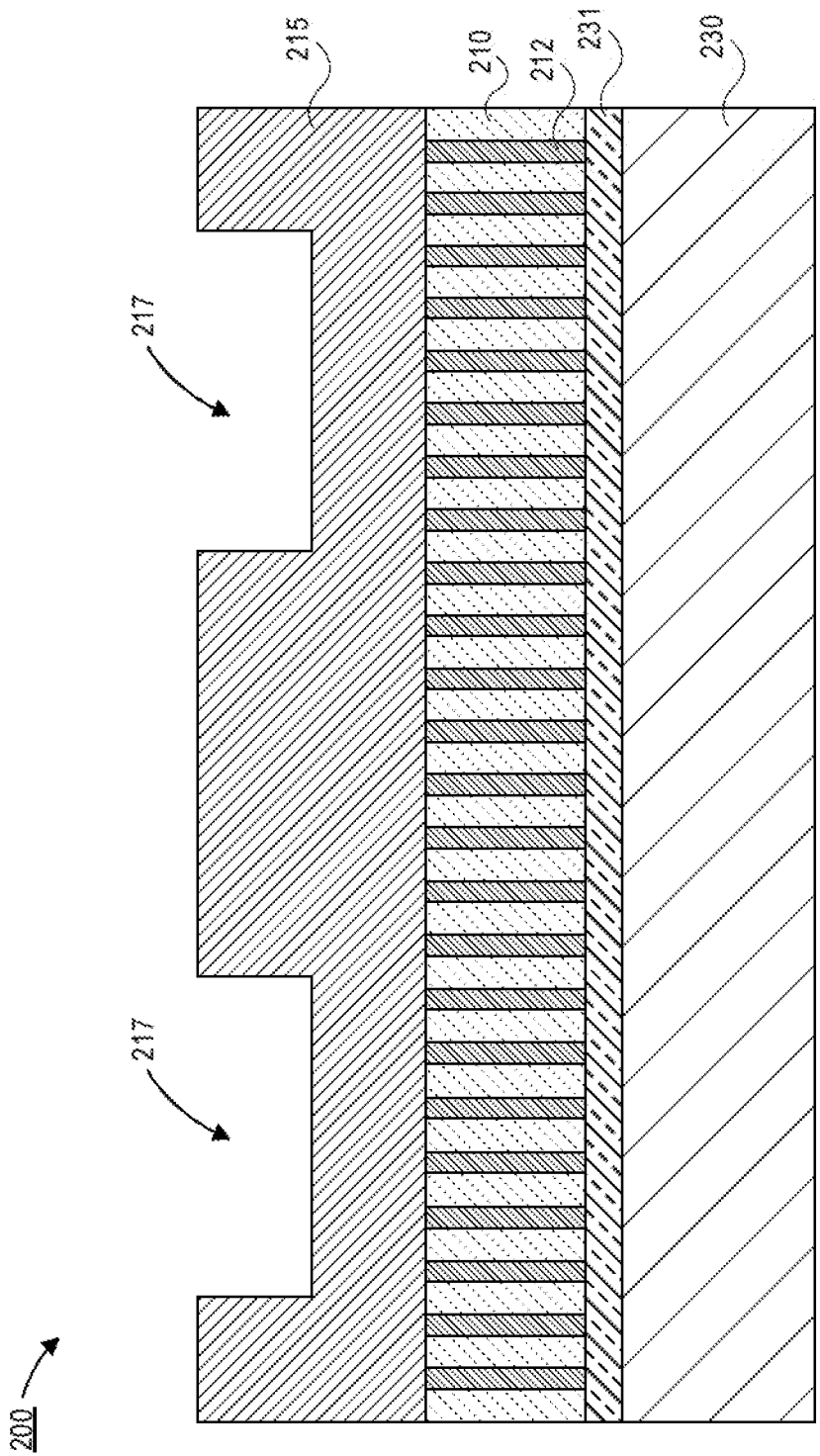
FIG. 2C is a cross-sectional illustration after cavities are formed into the dielectric substrate, in accordance with an embodiment.

Referring now to FIG. 2C, a cross-sectional illustration of the electronic package 200 after cavities 217 are formed into the dielectric substrate 215 is shown, in accordance with an embodiment. In an embodiment, the cavities 217 may be formed into a surface (i.e., the top surface) of the dielectric substrate 215. In an embodiment, the cavities 217 do not pass entirely through a thickness of the dielectric substrate 215. In the illustrated embodiment, two cavities 217 are formed in the dielectric substrate 215. However, it is to be appreciated that any number of cavities 217 may be used depending on the desired structure.

In an embodiment, the cavities 217 may be fabricated with any suitable process. In some embodiments, the cavities 217 may be fabricated with a laser ablation process. In such instances, the sidewall profile of the cavities may be tapered, or otherwise sloped. In some embodiments, the cavities 217 may be fabricated with a lithographic process.

Figure 2D:
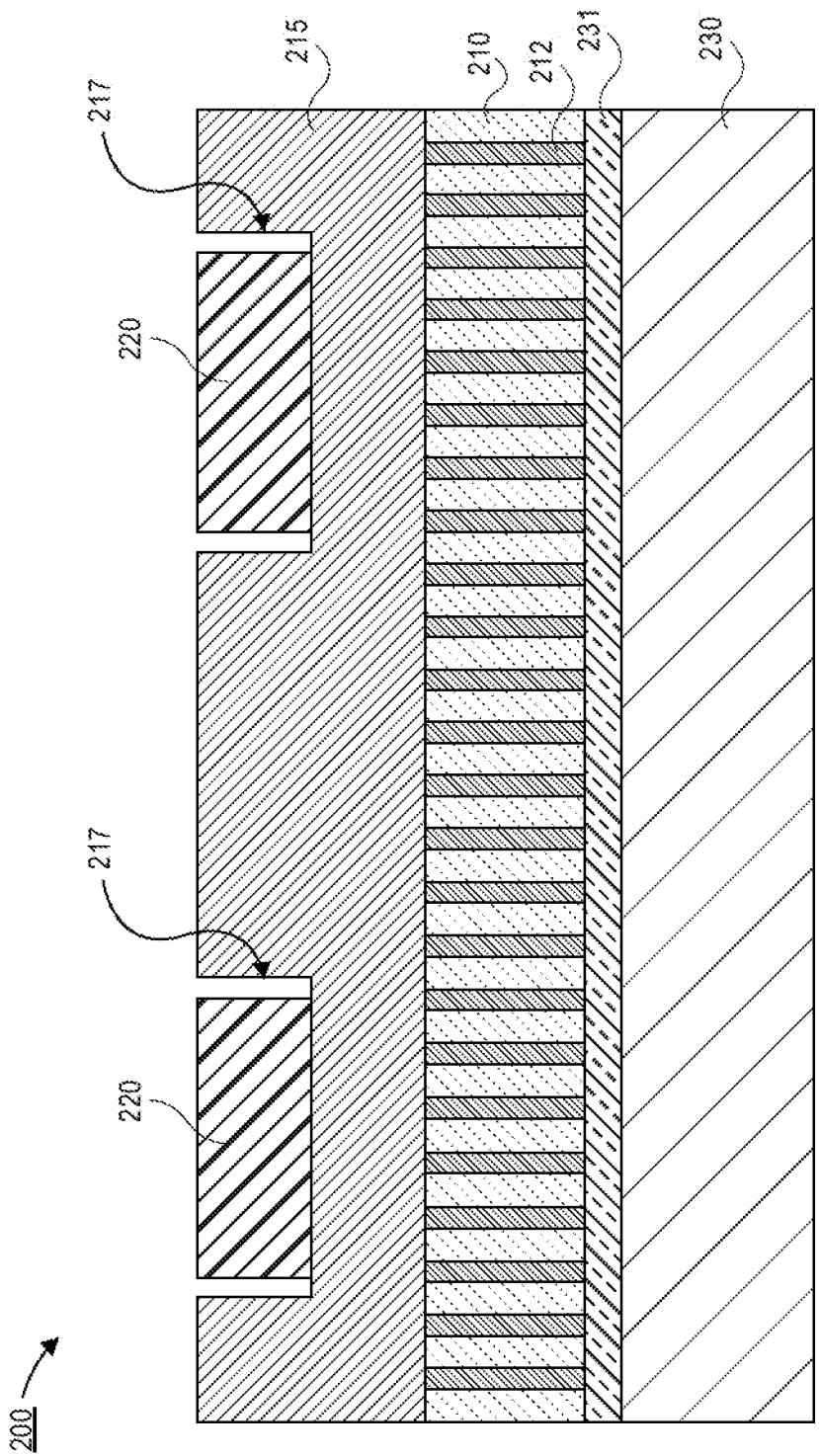
FIG. 2D is a cross-sectional illustration after bridges are disposed in the cavities, in accordance with an embodiment.

Referring now to FIG. 2D, a cross-sectional illustration of the electronic package 200 after bridges 220 are placed into the cavities 217 is shown, in accordance with an embodiment. In an embodiment, the bridges 220 may be placed in the cavities 217 with a pick and place tool, or the like. The bridges 220 may have dimensions that allow for them to be entirely within the cavity 217. For example, the top surface of the bridge 220 may be substantially coplanar with a top surface of the dielectric substrate 215. In other embodiments, a top surface of the bridge 220 may be recessed below a top surface of the dielectric substrate 215 or extend above the top surface of the dielectric substrate 215.

Figure 2E:
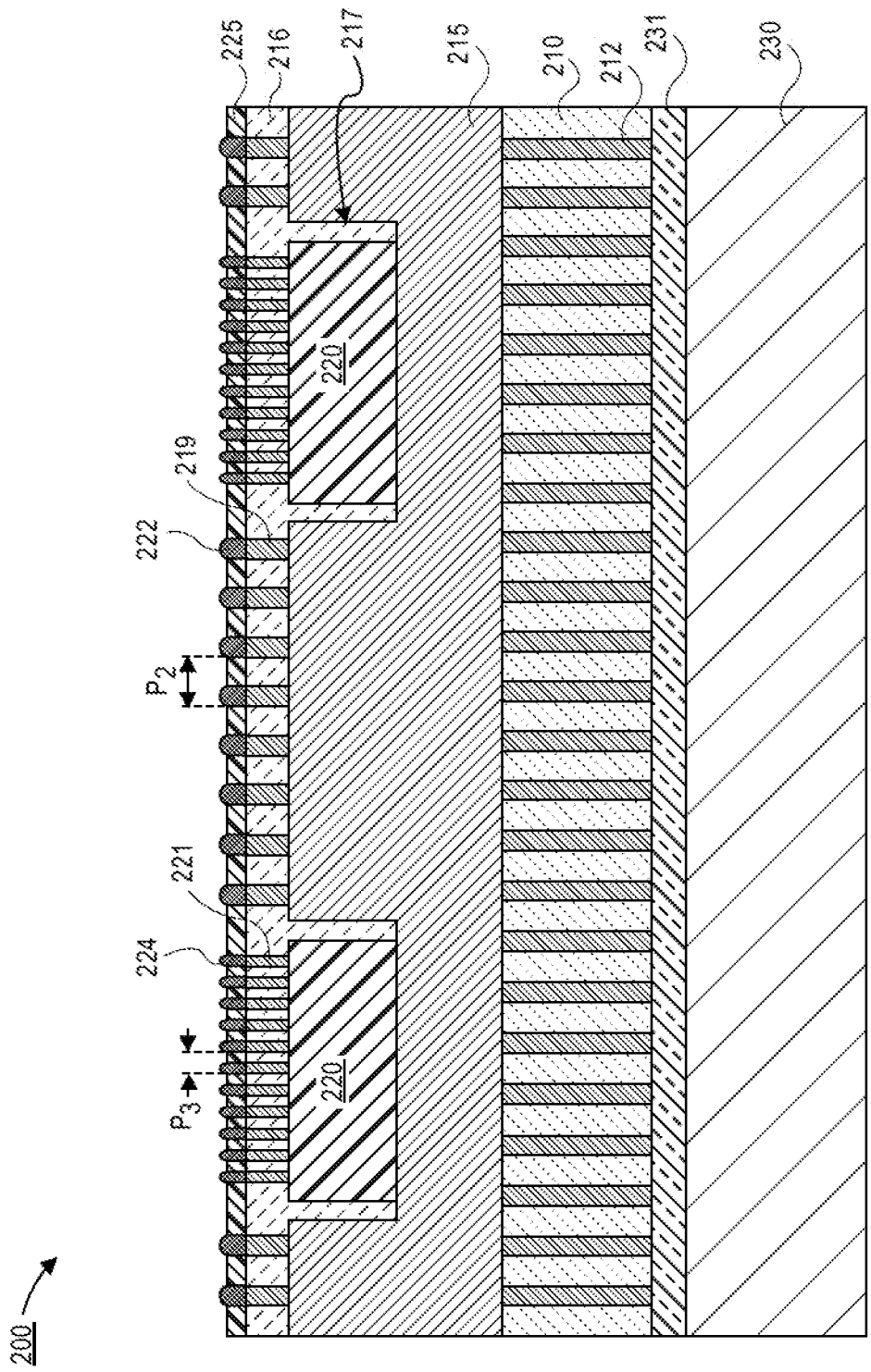
FIG. 2E is a cross-sectional illustration after a dielectric layer is disposed over the bridge and the dielectric substrate, and vias and contacts are made, in accordance with an embodiment.

Referring now to FIG. 2E, a cross-sectional illustration of the electronic package 200 after the bridges 220 are fully embedded is shown, in accordance with an embodiment. In an embodiment, the bridges 220 may be embedded by disposing a dielectric layer 216 over the top surface. In an embodiment, the dielectric layer 216 may also fill remaining space in the cavity 217 not occupied by the bridge 220. That is, in some embodiments, the dielectric layer 216 may cover sidewall surfaces and a top surface of the bridge 220. The dielectric layer 216 may also be disposed over the top surface of the dielectric substrate 215. While the dielectric layer 216 and the dielectric substrate 215 are shown with different shading, it is to be appreciated that dielectric layer 216 and the dielectric substrate 215 may comprise the same material. In some embodiments, there may not be a discernable boundary between the dielectric layer 216 and the dielectric substrate 215. In an embodiment, the dielectric layer 216 may be disposed over the dielectric substrate 215 with a lamination process or the like.

In FIGS. 2C-2E, the bridges 220 are placed in cavities 217 formed into the dielectric substrate 215. However, it is to be appreciated that embodiments may also include bridges 220 that are placed over an intermediate layer of the dielectric substrate 215 or directly on the surface of the reinforcement substrate 210. In such embodiments, subsequent layers of the dielectric substrate 215 may be disposed over the bridge 220 instead of placing the bridge 220 in the cavity.

In an embodiment, a plurality of vias 219, 221 may be disposed through the dielectric layer 216. Vias 219 may pass through the dielectric layer 216 over regions where there are no cavities 217. The vias 219 may electrically couple with conductive features (not shown) in the dielectric substrate (e.g., pads, traces, vias, etc.). Accordingly, an electrical connection from the vias 219 to the through substrate vias 212 may be provided.

In an embodiment, the vias 219 may have a second pitch $P_2$. In an embodiment, the second pitch $P_2$ may be substantially equal to the first pitch $P_1$ of the through substrate vias 212. In some embodiments, the vias 219 may be aligned with the through substrate vias 212. That is, each of the vias 219 may be aligned above one of the through substrate vias 212. In such an embodiment, there may be no need for any pitch translation in the dielectric substrate 215. In an embodiment, the second pitch $P_2$ may be different than the first pitch $P_1$. In such embodiments, pitch translation may be implemented in the dielectric substrate 215.

In an embodiment, vias 221 may be positioned over the bridges 220. The vias 221 may land on pads (not shown) of the bridges 220. The vias 221 may have a third pitch $P_3$. The third pitch $P_3$ may be smaller than the first pitch $P_1$ and the second pitch $P_2$. In an embodiment, the third pitch $P_3$ may be sufficient for FLS connections of the bridge 220.

In an embodiment, a solder resist 225 may be disposed over the dielectric layer 216. The solder resist 225 may be disposed with a lamination process, or the like. In an embodiment, the solder resist 225 may comprise a plurality of solder resist openings (SROs). The SROs may be positioned over the vias 219, 221. The SROs may be filled with solder. For example, solder 224 may be disposed in the SROs over the vias 221, and solder 222 may be disposed in the SROs over the vias 219.

Figure 2F:
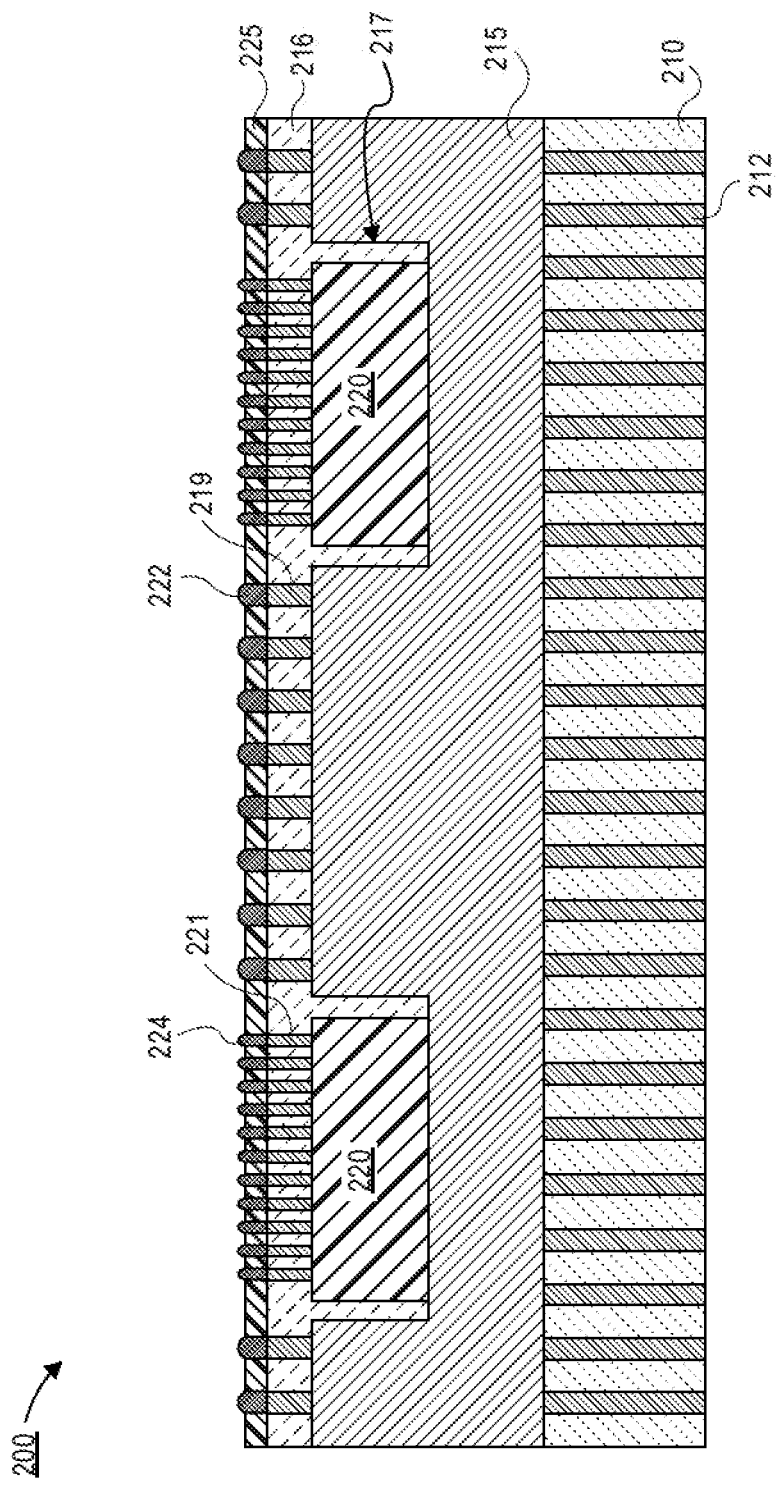
FIG. 2F is a cross-sectional illustration after the carrier is removed, in accordance with an embodiment.

Referring now to FIG. 2F, a cross-sectional illustration of the electronic package 200 after the carrier 230 is removed is shown, in accordance with an embodiment. In an embodiment, the carrier 230 may be removed by exposing the adhesive 231 to ultraviolet radiation. For example, the carrier 230 may be transparent to ultraviolet radiation, and the ultraviolet radiation may pass through the bottom surface of the carrier 230 to expose the adhesive 231. In other embodiments, the carrier 230 may be mechanically separated from the reinforcement substrate 210. In some embodiments, the bottom surface of the reinforcement substrate 210 may be cleaned (to remove any residual adhesive material) after removal of the carrier 230.

In embodiments where the electronic package is formed in a panel level, quarter panel level, strip, or the like, the electronic package 200 may be singulated after removal of the carrier 230. In some embodiments, singulation may refer to singulating groups of two or more electronic packages 200 (e.g., to form quarter panels, strips, or smaller units). In other embodiments, the singulation may refer to singulating all of the electronic packages 200 so that each electronic package 200 is an individual unit.

Figure 2G:
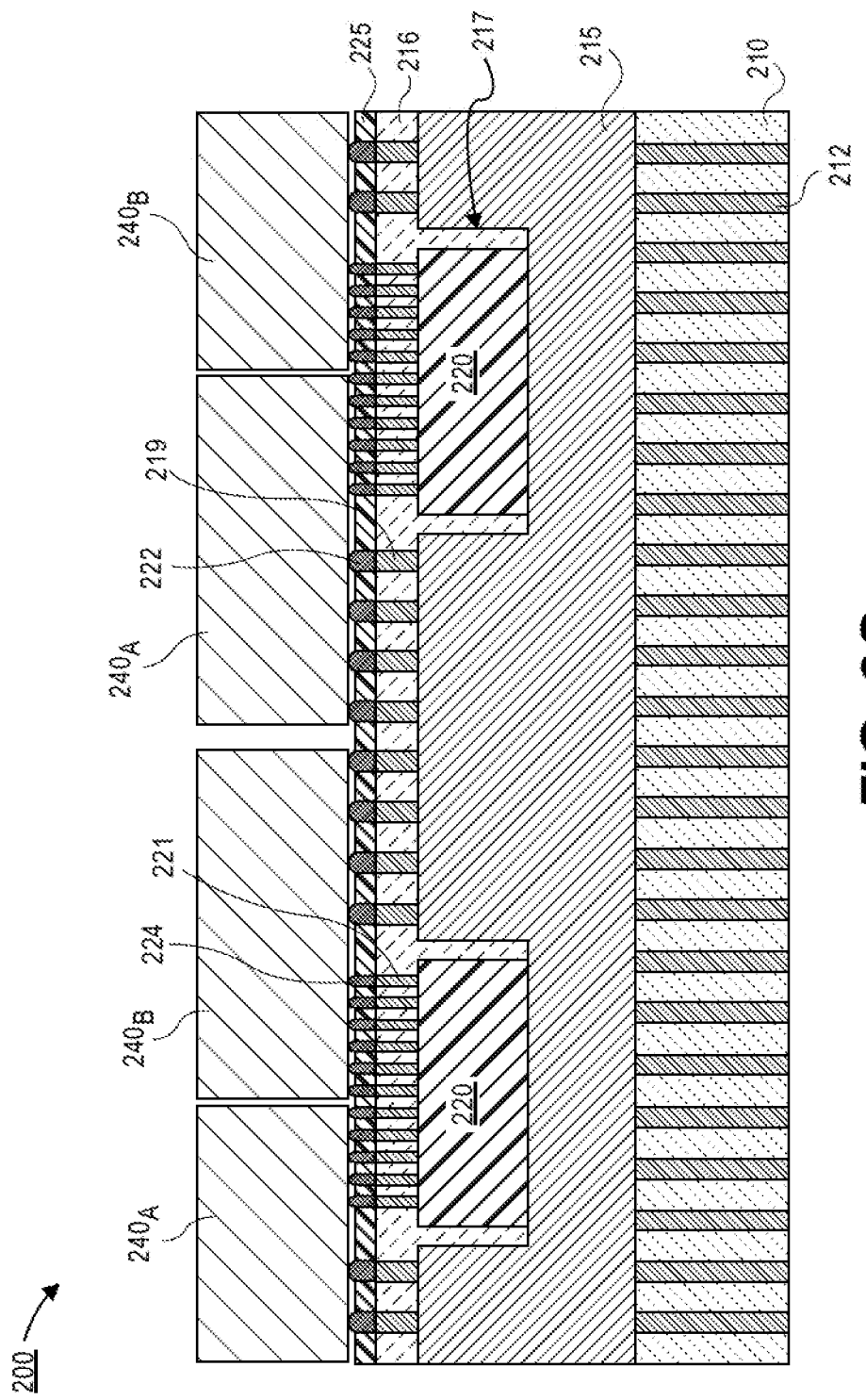
FIG. 2G is a cross-sectional illustration after dies are mounted to electronic package, in accordance with an embodiment.

Referring now to FIG. 2G, a cross-sectional illustration of the electronic package 200 after a plurality of dies 240 are attached to the electronic package 200 is shown, in accordance with an embodiment. In an embodiment, the dies may comprise a first die 240A and a second die 240B. The first die 240A may be electrically coupled to a first end of the bridge 220 by solder 224 and vias 221, and the second die 240B may be electrically coupled to a second end of the bridge 220 by solder 224 and vias 221. That is, the bridge 220 may provide FLS traces that electrically couple the first die 240A to the second die 240B. In an embodiment, the first die 240A and the second die 240B may also be electrically coupled to the dielectric substrate 215 by solder 222 and vias 219.

After attachment of the dies 240, processing may continue with standard processes. For example, underfill and/or mold layers may be disposed over and around the dies 240. In some embodiments, the singulation of the electronic package 200 may be implemented after the attachment of the first dies 240A and the second dies 240B. For example, the singulation to individual electronic packages 200 may be implemented after over molding the dies 240 or before over molding the dies 240.

Figure 3A:
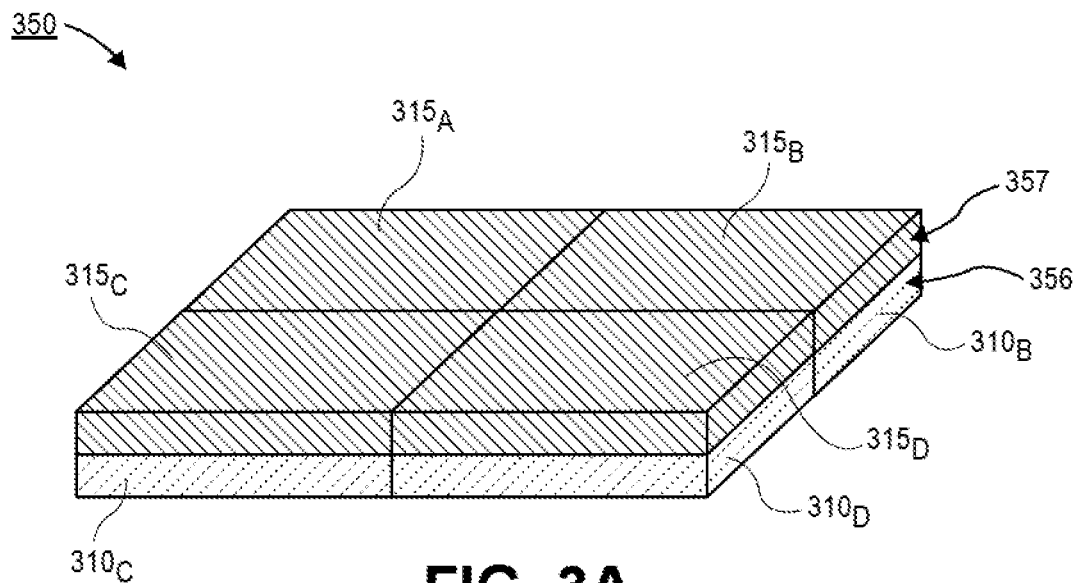
FIG. 3A is a perspective view of the reinforcement substrate and the dielectric substrate, in accordance with an embodiment.
Figure 3B:
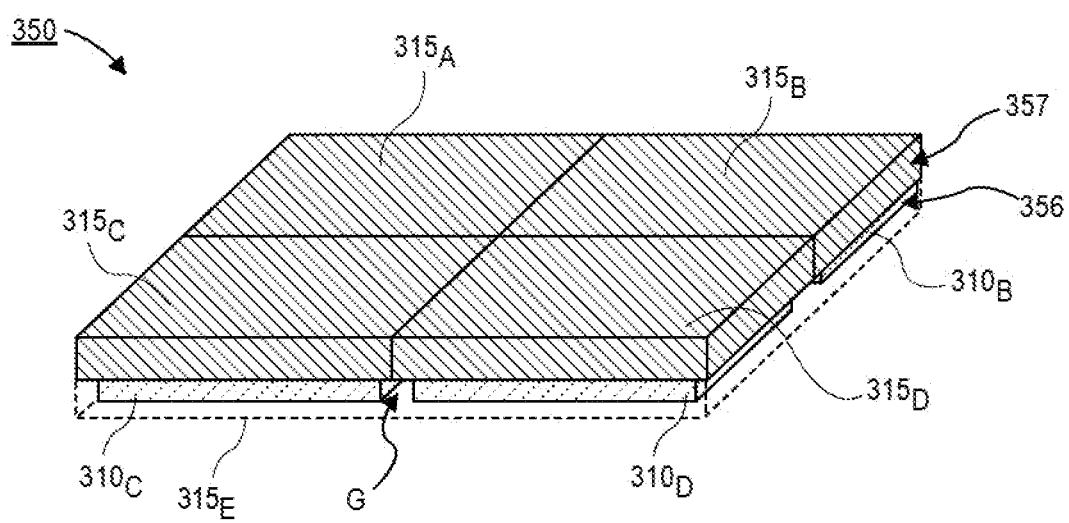
FIG. 3B is a perspective view of the reinforcement substrate and the dielectric substrate, where the reinforcement substrate has edges that are recessed from edges of the dielectric substrate, in accordance with an embodiment.

Referring now to FIGS. 3A and 3B, perspective view illustrations of a portion of a panel is shown, in accordance with an embodiment. In FIGS. 3A and 3B, components (e.g., cavities, bridges, vias, through substrate vias, etc.) are omitted for simplicity. Particularly, only the reinforcement substrate 310 and the dielectric substrate 315 are shown for simplicity.

Referring now to FIG. 3A, a perspective view illustration of a portion of a panel 350 is shown, in accordance with an embodiment. As shown, the reinforcement substrate 310 may be a monolithic layer. That is the reinforcement layer may comprise portions $310_{A-D}$ (it is noted that $310_A$ is not visible in FIG. 3A) that are in direct contact with each other. That is, portions $310_{A-D}$ may be portions of a single substrate. As shown, the dielectric substrate 315 may extend over the entire surface of the reinforcement substrate 310. For example, dielectric substrate 315 may comprise portions $315_{A-D}$, where each portion $315_{A-D}$ is where a single electronic package will be fabricated. As shown, an edge 356 of the reinforcement substrate 310 is substantially coplanar with an edge 357 of the dielectric substrate 315. Such an embodiment will lead to the fabrication of an electronic package that is substantially similar to the embodiments disclosed in FIGS. 1A and 1B.

Referring now to FIG. 3B, a perspective view illustration of a panel 350 is shown in accordance with an additional embodiment. As shown, the reinforcement substrate 310 may comprise a plurality of discrete portions $310_{A-D}$ (it is noted that $310_A$ is not visible in FIG. 3B). In an embodiment, each of the portions $310_{A-D}$ may be separated from each other by a gap G. The gaps G may be aligned below the dicing paths of the dielectric substrate 315. That is, the boundaries (as indicated by the lines) between portions $315_{A-D}$ may be located over the gaps G. As such, singulation of the dielectric substrate 315 may be implemented without needing to cut through the reinforcement substrate 310. This improves manufacturability of the devices.

In an embodiment, the gaps G result in sidewalls 356 of portions of the reinforcement substrate $310_{A-D}$ being recessed from sidewalls 357 of the portions of the dielectric substrate $315_{A-D}$. As shown in FIG. 3B, a dashed outline 315E is shown surrounding the portions of the reinforcement substrate $310_{A-D}$. Particularly, the dashed outline represents the continuation of the dielectric substrate 315 down into the gaps G and around the portions of the reinforcement substrate $310_{A-D}$. Portion 315E is illustrated with the dashed lines in order to not obscure the view of the portions of the reinforcement substrate $310_{A-D}$. It is to be appreciated that portion 315E may be a continuous layer with dielectric substrate $315_{A-D}$ above. Such an embodiment will lead to the fabrication of an electronic package that is substantially similar to the embodiments disclosed in FIG. 1C.

Figure 4:
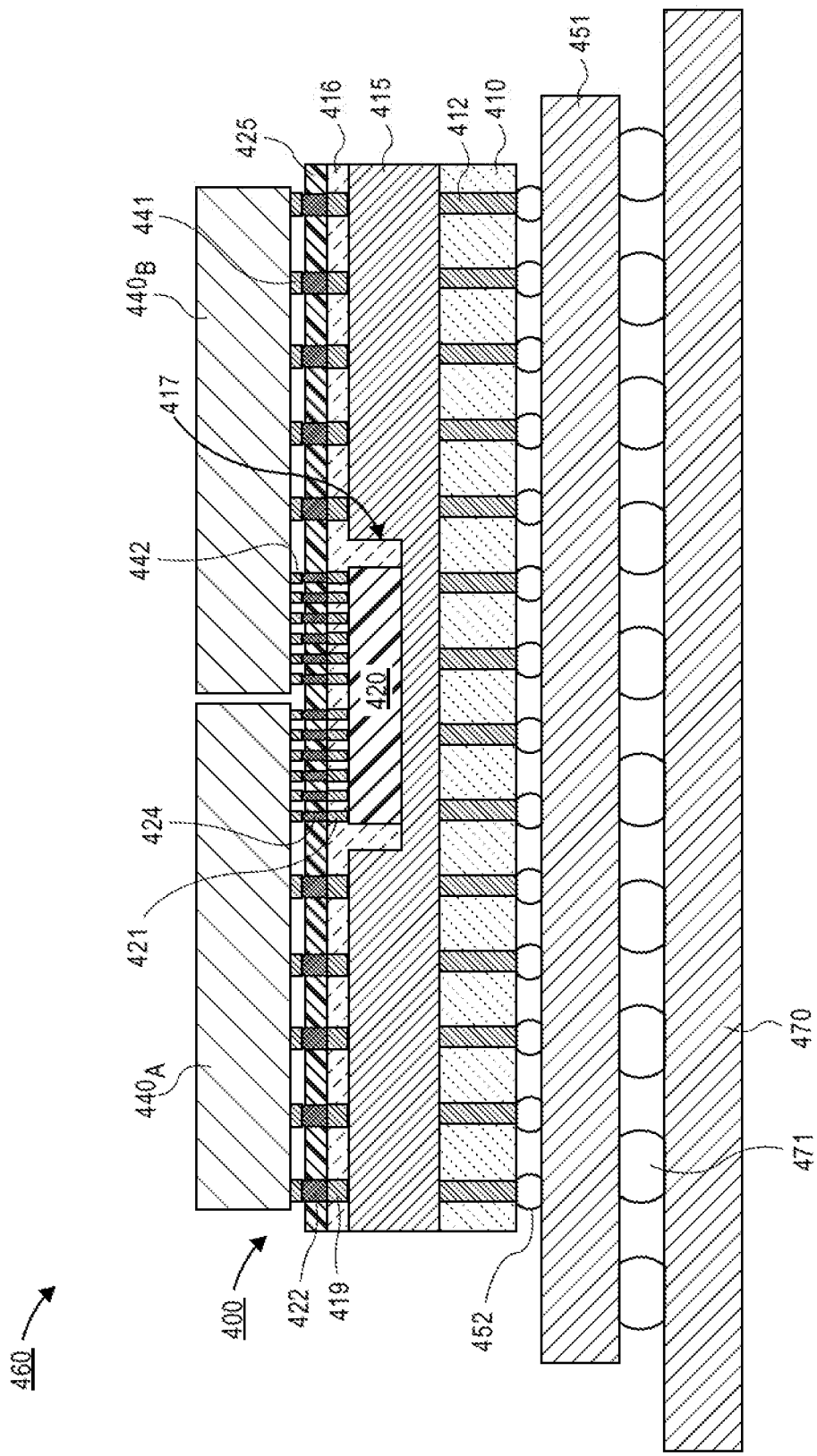
FIG. 4 is a cross-sectional illustration of an electronic system that comprises a package on interposer (PoINT) architecture with EMIBs embedded in the dielectric layer, in accordance with an embodiment.

Referring now to FIG. 4, a cross-sectional illustration of an electronic system 460 is shown, in accordance with an embodiment. In an embodiment, the electronic system 460 may be a package on interposer (PoINT) system. For example, the electronic system may comprise an electronic package 400 that is attached to an interposer 451. For example, the electronic package 400 may be electrically and mechanically coupled to the interposer 451 with interconnects 452. In some embodiments, the interconnects 452 may be referred to as mid-level interconnects (MLI). In an embodiment, the interconnects 452 may comprise solder or the like.

In an embodiment, the interposer 451 may be electrically and mechanically coupled to a board 470 (e.g., a printed circuit board (PCB), motherboard, or the like). In an embodiment, the interposer 451 may be coupled to the board 470 with interconnects 471. In an embodiment, the interconnects 471 may be referred to as second level interconnects.

In an embodiment, the electronic package 400 may be substantially similar to electronic packages described above (e.g., the electronic packages 100, 101, and 102 described with respect to FIGS. 1A-1C). For example, the electronic package 400 comprises a reinforcement layer 410 with through substrate vias 412. In an embodiment, a dielectric substrate 415 may be positioned over the reinforcement layer 410. The reinforcement lay 415 may comprise one or more cavities 417 formed into a surface. The cavity 417 may house one or more bridges 420. In an embodiment, a dielectric layer 416 may be disposed over the dielectric substrate 415 and the bridge 420. The dielectric layer 416 may also fill remaining space in the cavity 417. Accordingly, the bridge is embedded by the dielectric layer 416 and the dielectric substrate 415.

In an embodiment, vias 419, 421 may be formed through the dielectric layer 416. The vias 421 over the bridge 420 may have a fine pitch, and vias 419 may have a pitch that is larger than the pitch of the vias 421. In some embodiments, the vias 419 may have the same pitch as the through substrate vias 412. In other embodiments, the vias 419 may be aligned over the through substrate vias 412. In some embodiments, the vias 419 may have a different pitch than the through substrate vias 412. In such embodiments, pitch translation may be implemented in the dielectric substrate with conductive features (not shown).

In an embodiment, a solder resist 425 with SROs filled with solder 422, 424 may be positioned over the dielectric layer 416. In an embodiment, the solder 422, 424 may electrically couple pads 441, 442 of the first die 440A and the second die 440B to the electronic package 400. In an embodiment, FLS traces (not shown) of the bridge 420 may electrically couple the first die 440A to the second die 440B.

FIG. 5 illustrates a schematic of computer system 500 according to an embodiment. The computer system 500 (also referred to as an electronic system 500) can include a semiconductor package comprising one or more in situ TFCs formed therein in accord with any of the embodiments and their equivalents as set forth in this disclosure. The computer system 500 may be a server system, a supercomputer, or a high-performance computing system, a mobile device, a netbook computer, a wireless smart phone, a desktop computer, a hand-held reader.

The system 500 can be a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In one embodiment, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512. As used herein, the processor 512 may mean any type of circuit such as, but not limited to, a microprocessor, a microcontroller, a graphics processor, a digital signal processor, or another processor. In an embodiment, the processor 512 includes, or is coupled with, a semiconductor package comprising one or more in situ TFCs formed therein in accordance with any of the embodiments and their equivalents, as described in the foregoing specification. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM). In one embodiment, the on-die memory 516 may be packaged with a process in accordance with any of the embodiments and their equivalents, as described in the foregoing specification.

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In an embodiment, the electronic system 500 also includes a display device 550 and an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

At least one of the integrated circuits 510 or 511 can be implemented in a number of different embodiments, including a semiconductor package comprising one or more in situ TFCs formed therein as described herein, an electronic system, a computer system, one or more methods of fabricating an integrated circuit, and one or more methods of fabricating a semiconductor package comprising one or more in situ TFCs formed therein, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to a semiconductor package comprising a stress absorption material in accordance with any of the disclosed embodiments as set forth herein and their art-recognized equivalents. A foundation substrate may be included, as represented by the dashed line of FIG. 5. Passive devices may also be included, as is also depicted in FIG. 5.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a reinforcement substrate; a plurality of through substrate vias through the reinforcement substrate; a dielectric substrate over the reinforcement substrate; a cavity into the dielectric substrate; and a component in the cavity.

Example 2: the electronic package of Example 1, wherein the component is a bridge.

Example 3: the electronic package of Example 1 or Example 2, wherein the plurality of through substrate vias have a first pitch, and wherein the bridge has contacts at a second pitch that is smaller than the first pitch.

Example 4: the electronic package of Examples 1-3, further comprising: a dielectric layer over the component, wherein the dielectric layer fills the cavity.

Example 5: the electronic package of Examples 1-4, wherein a plurality of vias are formed through the dielectric layer.

Example 6: the electronic package of Examples 1-5, wherein the plurality of through substrate vias have a first pitch, and wherein the plurality of vias have a second pitch.

Example 7: the electronic package of Examples 1-6, wherein the first pitch is equal to the second pitch.

Example 8: the electronic package of Examples 1-7, wherein each of the through substrate vias is aligned with one of the plurality of vias.

Example 9: the electronic package of Examples 1-8, wherein the first pitch is different than the second pitch.

Example 10: the electronic package of Examples 1-9, wherein pitch translation from the first pitch to the second pitch is implemented in the dielectric substrate.

Example 11: the electronic package of Examples 1-10, wherein a Young's modulus of the reinforcement layer is larger than a Young's modulus of the dielectric layer.

Example 12: the electronic package of Examples 1-11, wherein the Young's modulus of the reinforcement layer is between 60 GPa and 100 GPa.

Example 13: the electronic package of Examples 1-12, wherein a coefficient of thermal expansion (CTE) of the reinforcement layer is between 2 ppm and 10 ppm.

Example 14: the electronic package of Examples 1-13, further comprising: a first die over the dielectric substrate; and a second die over the dielectric substrate, wherein the first die is electrically coupled to the second die by the component.

Example 15: the electronic package of Examples 1-14, wherein an edge of the reinforcement substrate is substantially coplanar with an edge of the dielectric substrate.

Example 16: the electronic package of Examples 1-15, wherein an edge of the reinforcement substrate is recessed from an edge of the dielectric substrate.

Example 17: the electronic system, comprising: a board; an interposer over the board; and an electronic package over the interposer, wherein the electronic package comprises: a reinforcement substrate; a plurality of through substrate vias through the reinforcement substrate; a dielectric substrate over the reinforcement substrate; a cavity into the dielectric substrate; and a component in the cavity.

Example 18: the electronic system of Example 17, further comprising: a first die over the electronic package; and a second die over the electronic package.

Example 19: the electronic system of Example 17 or Example 18, wherein the first die is electrically coupled to the second die by the component.

Example 20: the electronic system of Examples 17-19, wherein the electronic package further comprises: a dielectric layer over the dielectric substrate, wherein vias are formed through the dielectric layer.

Example 21: the electronic system of Examples 17-20, wherein the plurality of through substrate vias have a first pitch, and wherein the vias have a second pitch.

Example 22: the electronic system of Examples 17-21, wherein the first pitch is equal to the second pitch.

Example 23: the electronic system of Examples 17-22, wherein the first pitch is different than the second pitch.

Example 24: the electronic system of Examples 17-23, wherein the component comprises pads, and wherein the pads have a third pitch that is smaller than the first pitch and the second pitch.

Example 25: a method of forming an electronic package, comprising: attaching a glass layer to a carrier; disposing a dielectric substrate over the glass layer; embedding a component in the dielectric substrate; releasing the glass layer from the carrier; and attaching a first die and a second die to the component.

Example 26: the method of Example 25, wherein embedding the component in the dielectric substrate comprises: forming a cavity in the dielectric substrate; placing the component in the cavity; and disposing a dielectric layer over the component.

Example 27: the method of Example 26, wherein embedding the component in the dielectric substrate, comprises: disposing a layer of the dielectric substrate over the glass layer; placing the component on the layer of the dielectric substrate; laminating one or more dielectric layers over the component.

Example 28: the method of Example 26 or Example 27, wherein embedding the component in the dielectric substrate, comprises: disposing the component directly on the glass layer; and laminating one or more dielectric layers over the component.

Example 29: the method of Examples 26-28, wherein the electronic package is singulated prior to attaching the first die and the second die to the component.

What is claimed is:

1. An electronic package, comprising:
   a reinforcement substrate;
   a plurality of through substrate vias through the reinforcement substrate;
   a dielectric substrate over the reinforcement substrate, wherein the dielectric substrate has a composition different than a composition of the reinforcement substrate;
   a cavity into the dielectric substrate; and
   a component in the cavity.

2. The electronic package of claim 1, wherein the component is a bridge.

3. The electronic package of claim 2, wherein the plurality of through substrate vias have a first pitch, and wherein the bridge has contacts at a second pitch that is smaller than the first pitch.

4. The electronic package of claim 1, further comprising:
   a dielectric layer over the component, wherein the dielectric layer fills the cavity.

5. The electronic package of claim 4, wherein a plurality of vias are formed through the dielectric layer.

6. The electronic package of claim 5, wherein the plurality of through substrate vias have a first pitch, and wherein the plurality of vias have a second pitch.

7. The electronic package of claim 6, wherein the first pitch of the plurality of through substrate vias is equal to the second pitch of the plurality of vias.

8. The electronic package of claim 7, wherein each of the through substrate vias is aligned with one of the plurality of vias.

9. The electronic package of claim 6, wherein the first pitch is different than the second pitch.

10. The electronic package of claim 9, wherein pitch translation from the first pitch to the second pitch is implemented in the dielectric substrate.

11. The electronic package of claim 1, wherein a Young's modulus of a material of the reinforcement substrate is larger than a Young's modulus of a material of the dielectric substrate.

12. The electronic package of claim 11, wherein the Young's modulus of the material of the reinforcement substrate is between 60 GPa and 100 GPa.

13. The electronic package of claim 1, wherein a coefficient of thermal expansion (CTE) of a material of the reinforcement substrate is between 2 ppm and 10 ppm.

14. The electronic package of claim 1, further comprising:
a first die over the dielectric substrate; and
a second die over the dielectric substrate, wherein the first die is electrically coupled to the second die by the component.

15. The electronic package of claim 1, wherein an edge of the reinforcement substrate is recessed from an edge of the dielectric substrate.

16. An electronic system, comprising:
a board;
an interposer over the board; and
an electronic package over the interposer, wherein the electronic package comprises:
a reinforcement substrate;
a plurality of through substrate vias through the reinforcement substrate;
a dielectric substrate over the reinforcement substrate;
a cavity into the dielectric substrate;
a component in the cavity; and
a dielectric layer over the dielectric substrate, wherein vias are formed through the dielectric layer.

17. The electronic system of claim 16, further comprising:
a first die over the electronic package; and
a second die over the electronic package.

18. The electronic system of claim 17, wherein the first die is electrically coupled to the second die by the component.

19. The electronic system of claim 16, wherein the plurality of through substrate vias have a first pitch, and wherein the vias have a second pitch.

20. An electronic package, comprising:
a reinforcement substrate;
a plurality of through substrate vias through the reinforcement substrate;
a dielectric substrate over the reinforcement substrate;
a cavity into the dielectric substrate; and
a component in the cavity; and
a dielectric layer over the component, wherein the dielectric layer fills the cavity.

21. The electronic package of claim 20, wherein a plurality of vias are formed through the dielectric layer.

22. The electronic package of claim 21, wherein the plurality of through substrate vias have a first pitch, and wherein the plurality of vias have a second pitch.

23. The electronic package of claim 22, wherein the first pitch is equal to the second pitch.

24. The electronic package of claim 23, wherein each of the through substrate vias is aligned with one of the plurality of vias.

25. The electronic package of claim 22, wherein the first pitch is different than the second pitch.

26. The electronic package of claim 25, wherein pitch translation from the first pitch to the second pitch is implemented in the dielectric substrate.

27. An electronic package, comprising:
a reinforcement substrate;
a plurality of through substrate vias through the reinforcement substrate;
a dielectric substrate over the reinforcement substrate, wherein an edge of the reinforcement substrate is recessed from an edge of the dielectric substrate;
a cavity into the dielectric substrate; and
a component in the cavity.

* * * * *